United States Patent
Atkinson et al.

(10) Patent No.: US 6,495,000 B1
(45) Date of Patent: Dec. 17, 2002

(54) SYSTEM AND METHOD FOR DC SPUTTERING OXIDE FILMS WITH A FINNED ANODE

(75) Inventors: James Mikel Atkinson, Camas, WA (US); Hirohiko Nishiki, Nara (JP); Patrick L. Guthrie, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/906,590

(22) Filed: Jul. 16, 2001

(51) Int. Cl.[7] ............................................. C23C 14/34
(52) U.S. Cl. ........................ 204/192.12; 204/298.06; 204/298.11; 204/298.14; 204/192.26; 204/192.29
(58) Field of Search ................... 204/298.06, 298.11, 204/298.14, 192.12, 192.15, 192.26, 192.29; 438/27, 30, 151

(56) References Cited

U.S. PATENT DOCUMENTS

| | | | | |
|---|---|---|---|---|
| 3,514,391 A | * | 5/1970 | Hablanian | 204/298.06 |
| 4,006,073 A | * | 2/1977 | Welch | 204/298.16 |
| 4,038,171 A | | 7/1977 | Moss et al. | 204/298.06 |
| 4,166,784 A | * | 9/1979 | Chapin et al. | 204/192.13 |
| 4,426,275 A | * | 1/1984 | Meckel et al. | 204/298.06 |
| 5,080,774 A | * | 1/1992 | Heitzer | 204/298.11 |
| 5,106,474 A | * | 4/1992 | Dickey et al. | 204/298.14 |
| 5,174,881 A | * | 12/1992 | Iwasaki et al. | 118/715 |
| 5,196,101 A | * | 3/1993 | Thakoor | 204/192.26 |
| 5,286,360 A | * | 2/1994 | Szczyrbowski et al. | 204/298.08 |
| 5,407,551 A | * | 4/1995 | Sieck et al. | 204/192.12 |
| 5,514,259 A | * | 5/1996 | Shiota et al. | 204/192.12 |
| 5,622,607 A | * | 4/1997 | Yamazaki et al. | 204/192.22 |
| 5,651,867 A | * | 7/1997 | Kokaku et al. | 118/719 |
| 6,149,784 A | | 11/2000 | Su et al. | 204/298.11 |
| 6,296,743 B1 | * | 10/2001 | Talieh | 204/192.22 |

FOREIGN PATENT DOCUMENTS

JP   11 229 132 A   *   8/1999

OTHER PUBLICATIONS

Article entitled "The Disappearing Anode Myth", by Jeff C. Sellers, www.enipower.com/technotes/disappearing.shtml.

* cited by examiner

Primary Examiner—Patrick Ryan
Assistant Examiner—Gregg Cantelmo
(74) Attorney, Agent, or Firm—David C. Ripma; Matthew D. Rabdau; Scott C. Krieger

(57) ABSTRACT

A system and method have been provided for an improved oxide deposition process using a DC sputtering magnetron. The invention prolongs the useful life of the anode by providing shielded electron collection surfaces, to minimize the deposition of insulator material on the anode. Specifically, the anode has a fin with a bottom electron collection surface that is shielded from the target material deposition. A small electro-magnet helps deflect the flow of electrons to the bottom surface of the fin. Vias in the fin promote the flow of electrons to the fin top surface, which is also shielded from the deposition material, even if deposition material begins to accumulate on the fin bottom surface.

30 Claims, 4 Drawing Sheets

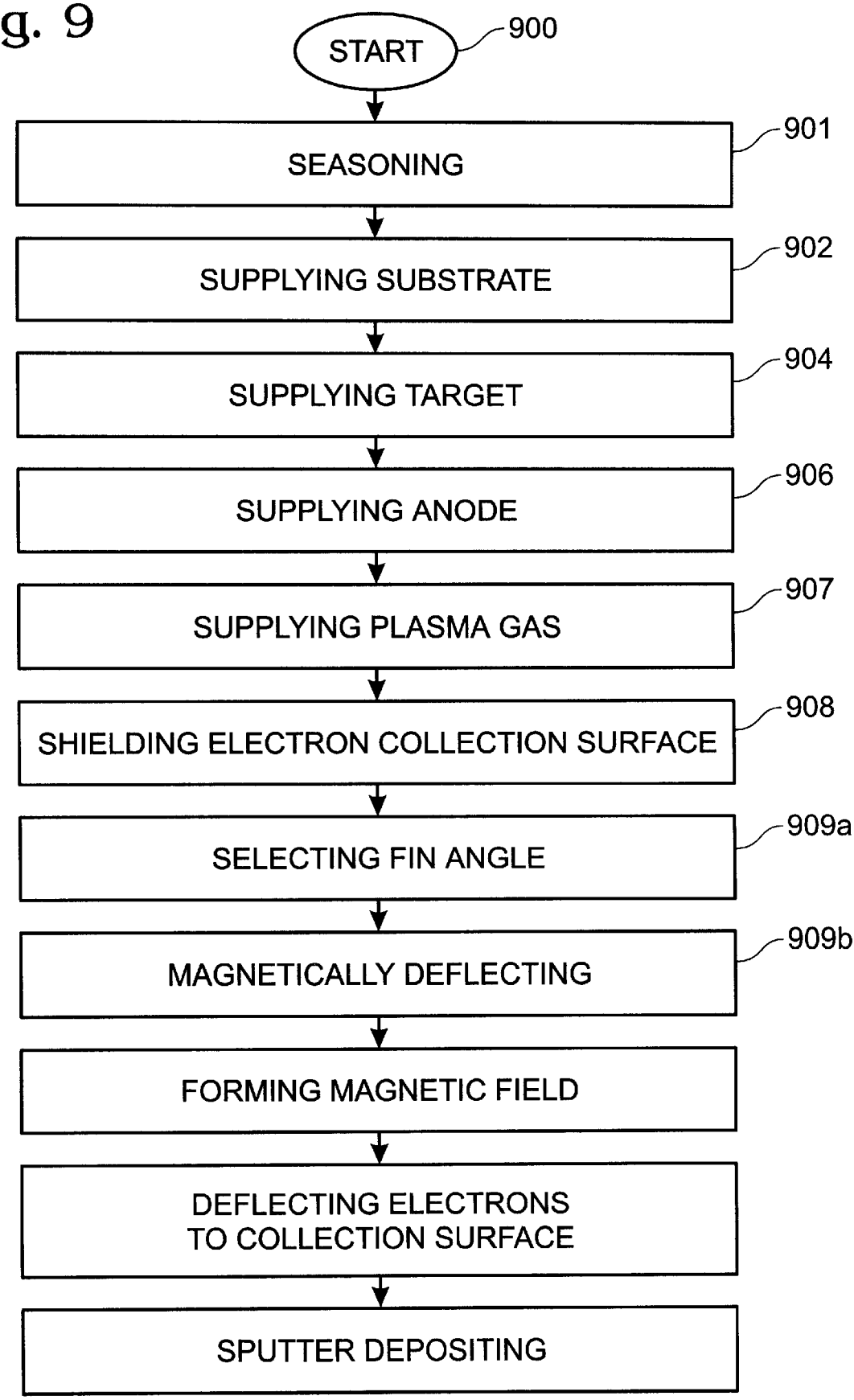

SYSTEM AND METHOD FOR DC SPUTTERING OXIDE FILMS WITH A FINNED ANODE

BACKGROUND OF THE INVENTION

1. Field of the Invention

This invention generally relates to the fabrication of liquid crystal displays and, more particularly, to a system and method of using a finned anode in the deposition of oxide films in a direct current (DC) sputtering deposition process.

2. Description of the Related Art

As noted in U.S. Pat. No. 6,149,784 (Su et al.), sputtering, or physical vapor deposition (PVD), is the favored technique for depositing materials, particularly metals and metal-based materials, in the fabrication of semiconductor integrated circuits. Sputtering has a high deposition rate and, in most cases, uses relatively simple and inexpensive fabrication equipment and relatively inexpensive material precursors, targets in the case of PVD. The usual type of sputtering used in commercial applications is DC magnetron sputtering, which is limited to the sputtering of metallic target. Sputtering is widely used for the deposition of aluminum (Al) to form metallization levels in semiconductor liquid crystal displays. More recently, copper deposition by PVD has been developed. However, sputtering is applicable to a wider range of materials useful in the fabrication of semiconductor integrated circuits. Reactive sputtering is well known in which a target of a metal, such as titanium or tantalum, is sputtered in the presence of a reactive gas in the plasma, most typically nitrogen. Thereby, the sputtered metal atoms react with the reactive gas to deposit a metal compound on the wafer, most particularly, a metal nitride, such as titanium nitride using a titanium target in a nitrogen ambient or tantalum nitride using a tantalum target in a nitrogen ambient.

FIG. 1 is a schematic block diagram, partial cross-section of a DC sputtering chamber, or reactor 100 (prior art). The reactor 100 is vacuum-sealed and has a target or cathode 102. Typically, the target 102 is a metal, but semiconductor and insulator materials can also be used. The target material is sputtered onto a substrate 104 held on a heater pedestal electrode 106 or an electrostatic chuck. An anode 108 acts as a dark space shield to protect the chamber wall 110 from the sputtered material and provides a return path or collection surface for the electrons emitted from the cathode target 102. A controllable pulsed DC power supply (not shown) negatively biases the target 102 with respect to the anode 108. Conventionally, the pedestal 106 and substrate 104 are left electrically floating, but a DC self-bias can be used to attract positively charged ions from the plasma.

Gas enters the reactor 100 from an inlet port 112, and gas exits through an exhaust port 114. The sputtering gas is often argon. The gas flow is regulated to maintain interior of the reactor 100 at a low pressure. The conventional pressure of the argon working gas is typically maintained at between about 1 and 1000 mTorr. When the argon is admitted into the reactor 100, the DC voltage applied between the target 102 and the anode 108 ignites the argon into a plasma, and the positively charged argon ions are attracted to the negatively charged target 102. The ions strike the target 102 at a substantial energy and cause target atoms or atomic clusters to be sputtered from the target 102. Some of the target particles strike the substrate 104 and are thereby deposited on it, thereby forming a film of the target material. Alternately, the target material reacts with gas added to the argon to form a composite film including target material.

To provide efficient sputtering, opposing magnets 116 and 118 produce a magnetic field within the reactor 100 in the neighborhood of the magnets 116, 118. The magnetic field traps electrons and, for charge neutrality, the ion density also increases to form a high-density plasma region 120 within the reactor adjacent to the target 102.

Plasma ignition can present a significant problem, especially in the geometries representative of a commercially significant plasma reactor. The initial excitation of a plasma requires a high voltage, though with essentially no current, to cause the working gas to be excited into the electrons and positive ions of an electron. This condition must persist for a time period and over a space sufficient to support a low-resistance, essentially neutral plasma between the two electrodes in the case of a capacitively coupled plasma. The maintenance of a plasma requires a feedback condition in which argon atoms must supply as many electrons to the anode as ions to target. If the flow of electrons to the anode is insufficient, the plasma collapses or is never formed.

Pulsed DC sputtering also provides a method for the low temperature (less than 2000 degrees C) deposition of oxide films, and should have advantages over the current plasma-enhanced chemical vapor deposition (PECVD) process. Low temperature processing is a critical when films are deposited on plastic substrates, such as the substrates used in the fabrication of flexible liquid crystal displays (LCDs). In addition, the pulsed DC sputtering of SiO2 and SiNx shows good promise from the viewpoint of high deposition rates and process flexibility. For example, the composition of the deposited film can be changed by simply changing gas mixture. However, the quality and deposition rate oxide films formed by pulsed DC sputtering is highly dependent on maintaining a good conductive anode for the electron return path.

FIG. 2 is a schematic block diagram of the chamber 100 of FIG. 1 after the processing of a few substrates (prior art). The same oxide film that is being deposited on the substrate 104 is also being deposited on the anode 108. Once the anode 108 is covered with oxide, a highly resistive material, the electron return path through the anode is eliminated. In response to the anode 108 being covered by the insulating film, changes occur in the plasma condition capacitance and electron flow in the chamber 100. As the oxide layer on the anode 108 increases, electrons charge the anode surface, which produces a large capacitance the chamber. The large capacitance creates micro arcing as the capacitance builds ups and discharges. When the anode is heavily coated, the capacitance in the chamber becomes very large and severe arcing will occur along with damage to the target 102.

Micro arcing is the first symptom that the anode is covered with insulator. Areas 200 of the substrate are damaged as a result of micro arcing. The resulting film can be nonuniform and of a poor quality. As the barrier layer on the anode increases in thickness, more severe arcing will take place in the vacuum chamber and eventually loss of plasma will occur. Severe arcing can cause damage. to the target 102 and result in the formation of large particles 202 on the substrate 104. Such damage creates manufacturing problems, such as a short anode life cycle, poor film quality, and low production yield, all a result of arcing in the chamber. Because arcing aggravates film quality and production yield, conventional design anodes must be frequently changed and cleaned. These frequent anode changes are detrimental to production efficiency.

FIG. 3 is a schematic block diagram of the chamber of FIG. 1 using an anode 108 having slits 300 on the anode surface (prior art). Alternately stated, the anode 108 has ribs 302 between the slits 300. The principle behind this modification is to increase the aspect ratio of the anode surface and, therefore, increase anode life for manufacturing. Although the vertical section of the ribs appear to collect less deposition material than the horizontal surfaces, the overall ratio between cathode and anode still increases as the anode gets coated. As the ratio between the cathode and anode changes, so does the chamber capacitance and plasma. In other words, effective area of anode decreases during the process and causes changes to the plasma distribution and film uniformity. After the insulating oxide film covers the anode, arcing occurs as described above.

It would be advantageous if electrical insulator material, such as oxide, could be deposited efficiently using a DC sputtering process.

It would be advantageous if the same anode in a DC magnetron could maintained in place through many substrate deposition cycles for greater manufacturing efficiency.

It would be advantageous if the electron collection surface of an anode could be kept free of deposition material during the DC sputtering of electrical insulator films.

SUMMARY OF THE INVENTION

The present invention relates to an improvement in the DC sputtering of oxide films on a substrate. This invention reduces the effects of the "disappearing anode" during DC sputtering of oxides on glass or other insulators. More specifically, a new anode concept is presented. The present invention anode provides a good electron return path, while maintaining the necessary aspect ratio between the cathode and the anode for longer periods of time. This new design anode incorporates an anode fin with holes in the surface of the fin. The fin shields a section of the anode from the oxide film to provide the return path for the electrons.

Accordingly, in a liquid crystal display (LCD) fabrication process including a pulsed DC sputtering system with a cathode and an anode, method is provided for depositing films. The method comprises: supplying a substrate having a horizontal top surface; supplying a target cathode of a first material; supplying an anode having an electron collection surface; shielding the electron collection surface of the anode from the deposition of a second material; and, sputter depositing the substrate top surface to form a second material film.

Shielding an electron collection surface of an anode from the target first material includes: forming an anode with vertical and horizontal ribs, and a fin having a top surface and a bottom surface to collect electrons, interposed between the anode ribs. Then, the method comprises: selecting the fin first angle, measured with respect to the substrate top surface. The exact fin angle is dependent upon factors such as the chamber size and other process specifics.

In some aspects of the invention, shielding an electron collection surface of an anode from the deposited second material includes forming vias from the fin top surface to the fin bottom surface to induce the collection of electrons on the fin top surface, through the vias. In other aspects, shielding an electron collection surface of an anode from the deposition of the second material includes magnetically defecting the flow of electrons to the electron collection surface.

Additional details of the above-described method, and a pulsed DC sputtering system for depositing films, are provided below.

BRIEF DESCRIPTION OF THE DRAWING

FIG. 9 is a flowchart illustrating a method for depositing films in a LCD fabrication process including a pulsed DC sputtering system with a cathode and an anode.

DETAILED DESCRIPTION OF THE PREFERRED EMBODIMENTS

Figure 1:
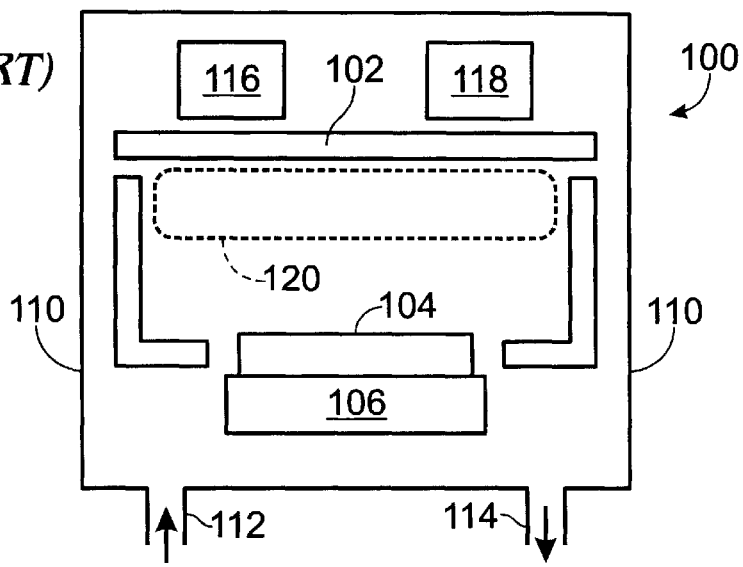
FIG. 1 is a schematic block diagram, partial cross-section of a DC sputtering chamber, or reactor 100 (prior art).
Figure 2:
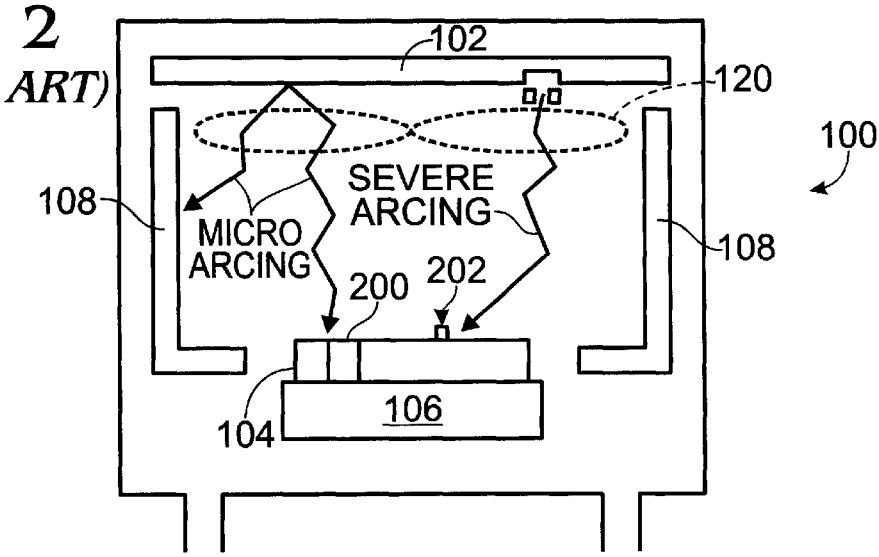
FIG. 2 is a schematic block diagram of the chamber of FIG. 1 after the processing of a few substrates (prior art).
Figure 3:
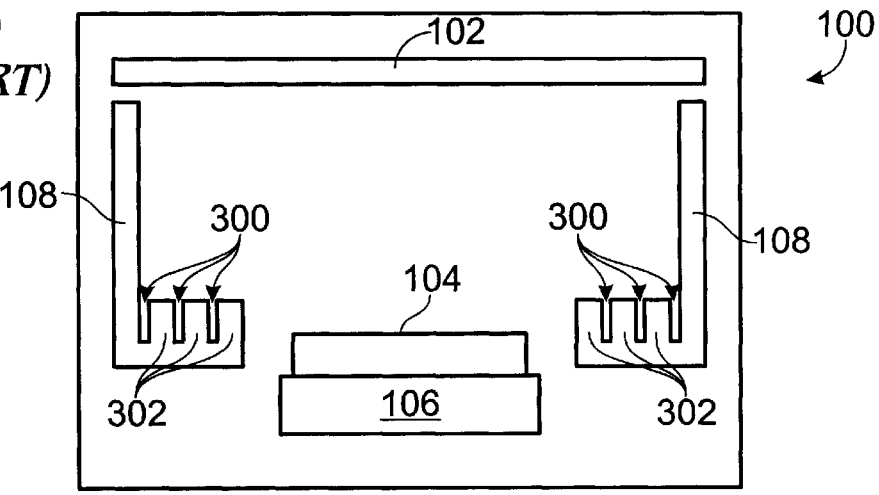
FIG. 3 is a schematic block diagram of the chamber of FIG. 1 using an anode having slits on the anode surface (prior art).
Figure 4:
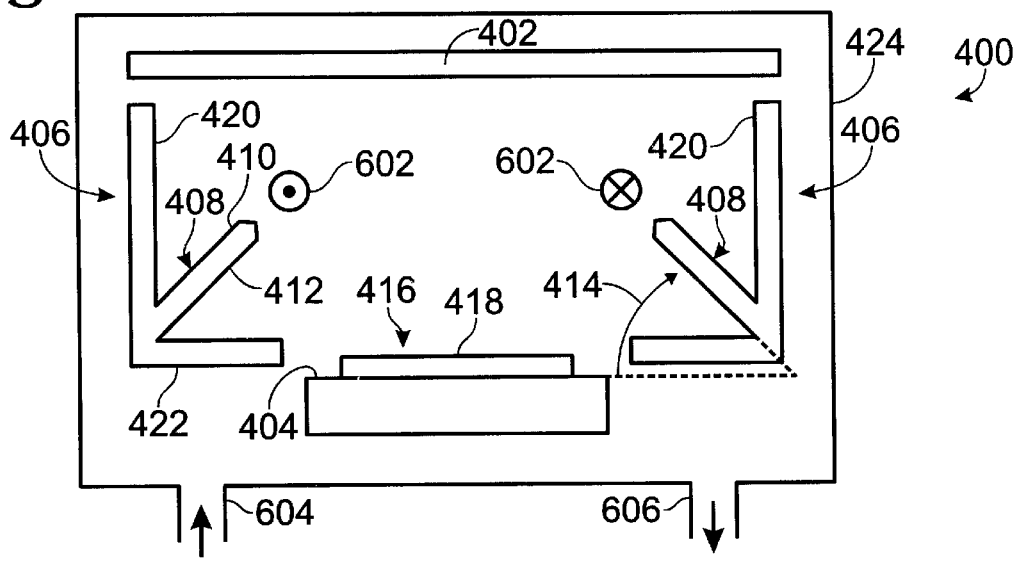
FIG. 4 is a schematic block diagram partial cross-sectional view of the present invention pulsed DC sputtering system for depositing films in a LCD fabrication process.

FIG. 4 is a schematic block diagram partial cross-sectional view of the present invention pulsed DC sputtering system 400 for depositing films in a LCD fabrication process. The system 400 comprises a target cathode 402 of a first material. The system 400 also comprises a substrate horizontal receiving surface 404. The substrate receiving surface 404 is typically the top surface of a chuck. The system 400 also comprises an anode 406 having a fin 408 with a top surface 410 and a bottom surface 412 to collect electrons. The fin 408 has a first angle 414 with respect to the substrate receiving surface 404. An insulator substrate 416, typically glass or plastic, with a top surface 418 overlies the substrate receiving surface 404. A second material film (not shown) is formed on the substrate top surface 418 as a result of the deposition process.

The anode 406 includes a vertical rib 420 and a horizontal rib 422, and the anode fin 408 is interposed between the anode ribs 420/422. The first angle 414 is selected in response to a variety of factors such as the size of chamber 424, the size of the substrate 416, the size and shape of the anode 406, the deposition material, plasma gases, and the desired deposition rate. In general, the fin first angle 414 is in the range from 20 degrees to 70 degrees. In many applications, however, the fin first angle 414 is approximately 45 degrees. The fin 408 is typically a stainless steel material.

Figure 5:
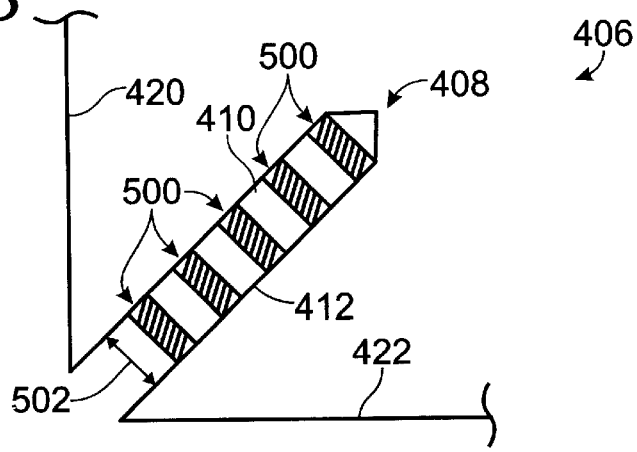
FIG. 5 is a more detailed cross-section of the fin of FIG. 4.

FIG. 5 is a more detailed cross-section of the fin 408 of FIG. 4. In some aspects of the invention, the fin 408 includes vias 500 formed from the fin top surface 410 to the fin bottom surface 412 to induce the collection of electrons on the fin top surface 410, through the vias 500. Typically, the fin vias 500 have a diameter of approximately 0.025 inches. The 408 has a thickness 502 of approximately 0.125 inches. The vias 500 in FIG. 5 are not drawn to scale.

Figure 6:
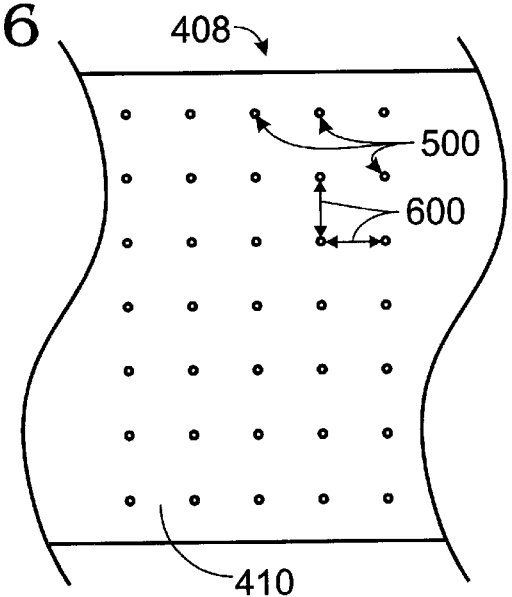
FIG. 6 is a top plan view of a section of fin illustrating the vias.

FIG. 6 is a top plan view of a section of fin 406 illustrating the vias 500. The vias 500 are arrayed in a dispersion pattern. A "square" dispersion pattern is shown, but the present invention is not limited to any particular pattern type. The vias 500 are separated by a via separation distance 600. The distance 600 between neighboring vias is equal, as the dispersion pattern is square. However, the distance between vias need not be equal when different dispersion patterns are used.

Returning to FIG. 4, in some aspects of the invention, an electro-magnet 602 with a magnetic field is mounted between the target cathode 402 and the anode 406. The field of the electro-magnetic 602 deflects the flow of electrons to the electron collection surface on the fin bottom surface 412. As is well known, the "dot" and "cross" markings in the electro-magnet represent opposite polarities. The electro-magnet 602 need not create an especially powerful field, because of their placement close to the fin 408. Typically, the electro-magnet 602 creates an electro-magnetic field having the strength of approximately 0.1 gauss (G). Alternately, a magnetic field can be applied to the plasma nearer the target 402. However, then the field must be much larger to be effective, in the neighborhood of 100 G.

The chamber 424 also has a gas input port 604 and exhaust port 606 to supply a plasma gas selected from the group including oxygen, argon, a mixture of argon and nitrogen, and a mixture of oxygen and argon. Oxygen is typically added to chemically react with the target first material. Likewise, nitrogen is added for the same purpose. The target cathode 402 first material is selected from the group including polycrystalline silicon, single-crystal silicon, silicon oxide, and silicon dioxide. The oxide targets need less chemical reaction with the plasma gas to form a second material insulator of the substrate 416. The second material film is selected from the group including silicon dioxide, silicon oxide, SiNx, and SiN2.

Although the fin 408 is designed to accumulate smaller deposits of insulator, it must still be cleaned on occasion. Preferably, the fin is designed to be removable from the anode 406. As is well known for the connection of related hardware, the fin 408 is connected to the anode 406 by a means selected from the group including welds and vented bolts (not shown). However connected, the fin has a secure electrical connection, typically enabled through the mechanical connection, to ensure low resistance electron flow from the fin 408 to the main body of the anode 406. The electrical resistance between the fin 408 and the anode 406 is typically less than one ohm. Preferably, the resistance is less than 0.5 ohms.

Figure 7:
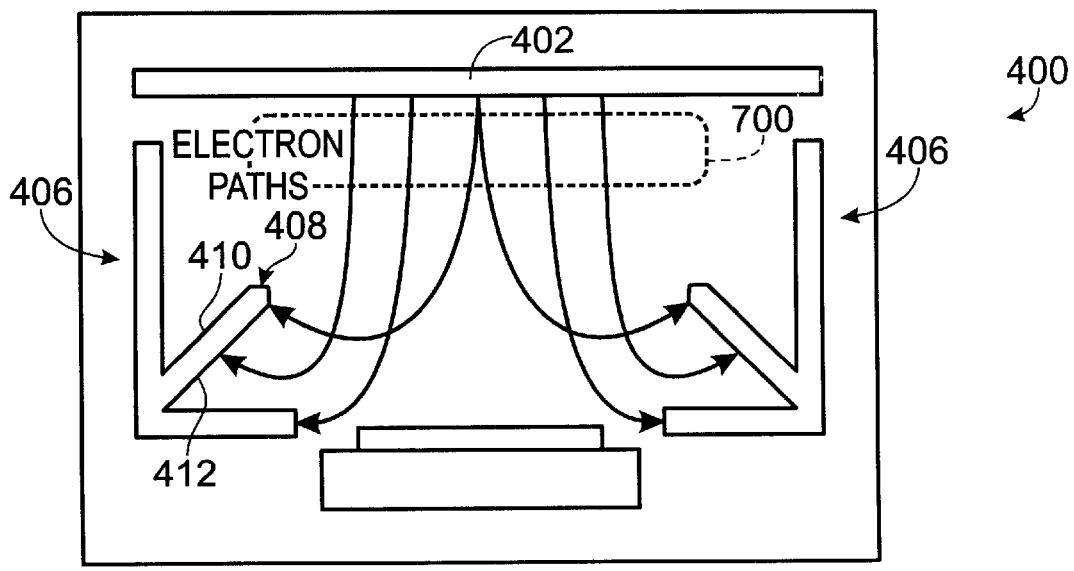
FIG. 7 is the system of FIG. 4 depicting the electron path flow to the anode.

FIG. 7 is the system 400 of FIG. 4 depicting the electron path flow to the anode. The fin has many holes machined along the top surface. These holes also provide an additional electron path and help maintain the cathode to anode aspect ratio. To prevent the effect of the "disappearing anode", an anode fin is added. The top surface 410 of the fin 408, and the bottom surface 412 are not covered by the sputtered atoms. Even if the ends of the fin 408 become covered due to their ejection angle, the electrons can flow into the anode. Even after the surface 412 is completely covered, the effective anode area is still large enough to support the plasma field 700.

As mentioned before in the description of conventional technologies, plasma distribution and deposition uniformity change as the anode surfaces become coated. This makes it very difficult to maintain an optimum processing condition. Therefore, It is very important to season the anode prior to starting a new process. The fin is seasoned with a thin coat of the material to be deposited on the substrate, typically an oxide. The first angle of the fins (see FIG. 4) is important factor in plasma stability, and is strongly dependent on the mechanical configuration of the chamber and the process conditions. Therefore, the fin angle must be optimized for each system and process.

Figure 8:
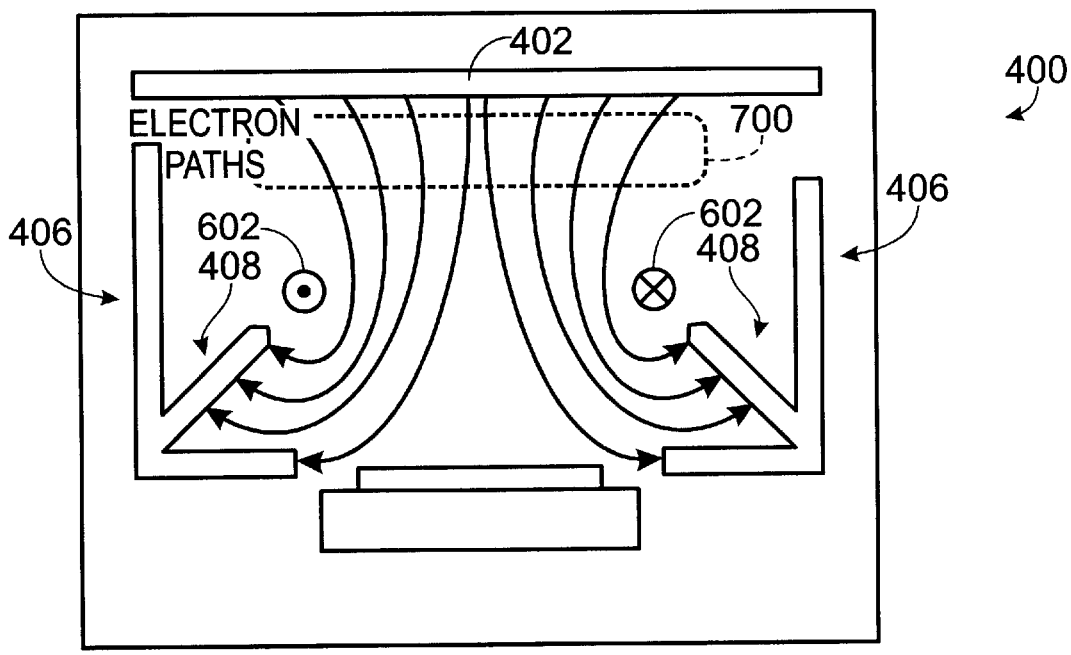
FIG. 8 is the system of FIG. 4 depicting the electron path to the anode when an electro-magnet is used.

FIG. 8 is the system 400 of FIG. 4 depicting the electron path to the anode when an electro-magnet 602 is used. In order to stabilize the plasma effectively, a magnetic field can be added near the fin 408. In a typical sputtering system, a strong magnetic field (100 G) is applied near target. However, a weak magnetic field is sufficient for the present invention if it is near the fin 408. The weak magnetic field, as shown, bends the electron path. Electrons coming from plasma 700 can reach the top surface 410 of the fin easily, to maintain stable plasma. In typical case, a weak magnetic field of 0.1 G is enough to bend the electron path with the radius of 4 centimeters (cm) about the electro-magnets 602.

FIG. 9 is a flowchart illustrating a method for depositing films in a LCD fabrication process including a pulsed DC sputtering system with a cathode and an anode. Although the method is depicted as a sequence of numbered steps for clarity, no order should be inferred from the numbering unless explicitly stated. The method begins as Step 900. Step 902 supplies an insulator substrate, typically of glass or plastic, having a horizontal top surface. Step 904 supplies a target cathode of a first material. The target cathode first material is selected from the group including polycrystalline silicon, single-crystal silicon, silicon oxide, and silicon dioxide. Step 906 supplies an anode having an electron collection surface.

Step 907 supplies a plasma gas selected from the group including oxygen, argon, a mixture of argon and nitrogen, and a mixture of oxygen and argon. Step 908 shields the electron collection surface of the anode from the deposition of a second material. Step 910 sputter deposits the substrate top surface to form a second material film. The second material film is selected from the group including silicon dioxide, SiNx, silicon oxide, and SiN2.

Shielding an electron collection surface of an anode from the target first material in Step 908 includes forming an anode with vertical and horizontal ribs, and a fin having a top surface and a bottom surface to collect electrons, interposed between the anode ribs. The fin is a material such as stainless steel. Then, a further step, Step 909a selects the fin first angle, measured with respect to the substrate top surface. Generally, selecting the fin first angle includes selecting the first angle to be in the range from 20 degrees to 70 degrees. Often, the first angle is selected to be approximately 45 degrees.

In some aspects of the invention, shielding an electron collection surface of an anode from the deposited second material in Step 908 includes forming vias from the fin top surface to the fin bottom surface to induce the collection of electrons on the fin top surface, through the vias. That is, the vias permit the top surface of the fin to become a shielded electron collection surface. The fin vias have a diameter of approximately 0.025 inches.

Some aspects of the invention include a further step. Step 909b magnetically defects the flow of electrons to the electron collection surface. Magnetically deflecting the flow of electrons to the electron collection surface includes sub-steps. Step 909b1 forms an electro-magnet with a magnetic field between the target cathode and the anode. Typically, forming an electro-magnet with a magnetic field between the target cathode and the anode includes forming an electro-magnetic field having the strength of approximately 0.1 gauss (G). Step 909b2 uses the field of the electro-magnetic to deflect the flow of electrons to the electron collection surface. Using the field of the electro-magnetic to deflect the flow of electrons to the electron collection surface includes deflecting the electron flow a radius of approximately 4 centimeters (cm).

Some aspects of the invention include a further step. Step 901, prior to supplying an anode having an electron collection surface, seasons the fin surfaces with a thin coat of oxide, or other insulator.

A system and method have been provided for improving the efficiency of oxide deposition using a DC magnetron. To prolong the useful life of the anode, a shielded electron collection surface has been developed. Specifically, an anode fin has been described to provide the shielded collection surface for general processes. Variations in the fin shape, size, and structure will occur to those skilled in the art as the concept is applied to specific applications.

We claim:

1. In a liquid crystal display (LCD) fabrication process including a pulsed direct current (DC) sputtering system with a cathode and an anode, method for depositing films comprising:

supplying an insulator substrate having a horizontal top surface;

supplying a target cathode of a first material;

supplying an anode having an electron collection surface;

shielding the electron collection surface of the anode from the deposition of a second material;

sputter depositing the substrate top surface to form a film of the second material; and, wherein shielding an electron collection surface of an anode from the target first material includes forming an anode with vertical and horizontal ribs, and a single fin having a top surface and a bottom surface to collect electrons, interposed between the anode ribs.

2. The method of claim 1 further comprising;

selecting a fin angle, measured with respect to the substrate top surface.

3. The method of claim 2 wherein selecting the fin angle includes selecting the angle to be in the range from 20 degrees to 70 degrees.

4. The method of claim 3 wherein selecting the fin angle includes selecting the angle to be approximately 45 degrees.

5. The method of claim 2 wherein shielding an electron collection surface of an anode from the deposited second material includes forming vias from the fin top surface to the fin bottom surface to induce the collection of electrons on the fin top surface, through the vias.

6. The method of claim 5 wherein the fin vias have a diameter of approximately 0.025 inches.

7. The method of claim 2 further comprising:

magnetically deflecting a flow of electrons to the electron collection surface.

8. The method of claim 7 wherein magnetically deflecting the flow of electrons to the electron collection surface includes:

forming an electro-magnet with a magnetic field between the target cathode and the anode;

using a field of the electro-magnetic to deflect the flow of electrons to the electron collection surface.

9. The method of claim 8 wherein forming an electro-magnet with a magnetic field between the target cathode and the anode includes forming an electro-magnetic field having the strength of approximately 0.1 gauss (G).

10. The method of claim 8 wherein using the field of the electro-magnetic to deflect the flow of electrons to the electron collection surface includes deflecting the electron flow a radius of approximately 4 centimeters (cm) about the electro-magnet.

11. The method of claim 8 wherein shielding an electron collection surface of an anode from the deposition of a second material includes forming vias from the fin top surface to the fin bottom surface to induce the collection of electrons on the fin top surface, through the vias.

12. The method of claim 1 wherein the target cathode first material is selected from the group including polycrystalline silicon, single-crystal silicon, silicon oxide, and silicon dioxide.

13. The method of claim 1 wherein the film of the second material is selected from the group including silicon dioxide, SiNx, silicon oxide, and SiN2.

14. The method of claim 1 further comprising:

supplying a plasma gas selected from the group including oxygen, argon, a mixture of argon and nitrogen, and a mixture of oxygen and argon.

15. The method of claim 1 wherein forming an anode with vertical and horizontal ribs, and a fin having a top surface and a bottom surface to collect electrons, interposed between the anode ribs includes forming a fin from a stainless steel material.

16. The method of claim 1 further comprising:

prior to supplying an anode having an electron collection surface, coating the fin surfaces with a thin coat of oxide.

17. The method of claim 1 wherein supplying a insulator substrate having a horizontal top surface includes supplying a substrate selected from the group including glass and plastic.

18. In a liquid crystal display (LCD) fabrication process, a pulsed direct current (DC) sputtering system for depositing films, the system comprising:

a target cathode of a first material;

a substrate horizontal receiving surface;

an anode having a single fin with a top surface and a bottom surface to collect electrons;

wherein the fin has an angle with respect to the substrate receiving surface;

wherein the anode includes vertical and horizontal ribs; and, wherein the anode fin is interposed between the anode ribs.

19. The system of claim 18 wherein the anode fin is a stainless steel material.

20. In a liquid crystal display (LCD) fabrication process, a pulsed direct current (DC) sputtering system for depositing films, the system comprising:

a target cathode of a first material;

a substrate horizontal receiving surface;

an anode having a single fin with a top surface and a bottom surface to collect electrons;

wherein the fin has an angle with respect to the substrate receiving surface; and, wherein the fin includes vias formed from the fin top surface to the fin bottom surface to induce the collection of electrons on the fin top surface, through the vias.

21. The system of claim 20 wherein the fin vias have a diameter of approximately 0.025 inches.

22. In a liquid crystal display (LCD) fabrication process, a pulsed direct current (DC) sputtering system for depositing films, the system comprising:

a target cathode of a first material;

a substrate horizontal receiving surface;

an anode having a single fin with a top surface and a bottom surface to collect electrons;

an electro-magnet with a magnetic field mounted between the target cathode and the anode;

wherein the field of the electro-magnetic deflects the flow of electrons to the electron collection surface on the fin bottom surface;

wherein the fin has an angle with respect to the substrate receiving surface; and, wherein the fin includes vias formed from the fin top surface to the fin bottom surface to induce the collection of electrons on the fin top surface, through the vias.

23. In a liquid crystal display (LCD) fabrication process, a pulsed direct current (DC) sputtering system for depositing films, the system comprising:

a target cathode of a first material;

a substrate horizontal receiving surface;

an anode having a fin with a top surface and a bottom surface to collect electrons; and, wherein the fin has a first angle with respect to the substrate receiving surface and wherein the fin includes vias formed from the fin top surface to the fin bottom surface to induce the collection of electrons on the fin top surface, through the vias.

24. The system of claim 23 wherein the fin vias have a diameter of approximately 0.025 inches.

25. In a liquid crystal display (LCD) fabrication process, a pulsed direct current (DC) sputtering system for depositing films, the system comprising:

a target cathode of a first material;

a substrate horizontal receiving surface;

an anode having a fin with a top surface and a bottom surface to collect electrons;

an electro-magnet with a magnetic field mounted between the target cathode and the anode;

wherein the field of the electro-magnet deflects the flow of electrons to the electron collection surface on the fin bottom surface; and, wherein the fin has a first angle with respect to the substrate receiving surface and wherein the fin includes vias formed from the fin top surface to the fin bottom surface to induce the collection of electrons on the fin top surface, through the vias.

26. In a liquid crystal display (LCD) fabrication process including a pulsed direct current (DC) sputtering system with a cathode and an anode, method for depositing films comprising:

supplying a insulator substrate having a horizontal top surface;

supplying a target cathode of a first material;

supplying an anode having an electron collection surface;

shielding the electron collection surface of the anode from the deposition of a second material; and sputter depositing the substrate top surface to form a second material film;

wherein shielding an electron collection surface of an anode from the target first material includes forming an anode with vertical and horizontal ribs, and a fin having a top surface and a bottom surface to collect electrons, interposed between the anode ribs;

wherein shielding an electron collection surface of an anode from the deposited second material includes forming vias from the fin top surface to the fin bottom surface to induce the collection of electrons on the fin top surface, through the vias; and, the method further comprising:

selecting the fin first angle, measured with respect to the substrate top surface.

27. The method of claim 26 wherein the fin vias have a diameter of approximately 0.025 inches.

28. In a liquid crystal display (LCD) fabrication process including a pulsed direct current (DC) sputtering system with a cathode and an anode, method for depositing films comprising:

supplying a insulator substrate having a horizontal top surface;

supplying a target cathode of a first material;

supplying an anode having an electron collection surface;

shielding the electron collection surface of the anode from the deposition of a second material; and sputter depositing the substrate top surface to form a second material film;

wherein shielding an electron collection surface of an anode from the target first material includes forming an anode with vertical and horizontal ribs, and a fin having a top surface and a bottom surface to collect electrons, interposed between the anode ribs;

wherein shielding an electron collection surface of an anode from the deposition of a second material includes forming vias from the fin top surface to the fin bottom surface to induce the collection of electrons on the fin top surface, through the vias;

the method further comprising:

selecting the fin first angle, measured with respect to the substrate top surface;

magnetically deflecting the flow of electrons to the electron collection surface;

wherein magnetically deflecting the flow of electrons to the electron collection surface includes:

forming an electro-magnet with a magnetic field between the target cathode and the anode;

using the field of the electro-magnetic to deflect the flow of electrons to the electron collection surface; and, wherein forming an electro-magnet with a magnetic field between the target cathode and the anode includes forming an electro-magnetic field having the strength of approximately 0.1 gauss (G).

29. In a liquid crystal display (LCD) fabrication process including a pulsed direct current (DC) sputtering system with a cathode and an anode, method for depositing films comprising:

supplying a insulator substrate having a horizontal top surface;

supplying a target cathode of a first material;

supplying an anode having an electron collection surface;

shielding the electron collection surface of the anode from the deposition of a second material;

sputter depositing onto the substrate top surface to form a second material film;

wherein shielding an electron collection surface of an anode from the target first material includes forming an anode with vertical and horizontal ribs, and a fin having a top surface and a bottom surface to collect electrons, interposed between the anode ribs; and, wherein forming an anode with vertical and horizontal ribs, and a fin having a top surface and a bottom surface to collect electrons, interposed between the anode ribs includes forming a fin from a stainless steel material.

30. In a liquid crystal display (LCD) fabrication process including a pulsed direct current (DC) sputtering system with a cathode and an anode, method for depositing films comprising;

supplying a insulator substrate having a horizontal top surface;

supplying a target cathode of a first material;

supplying an anode with a fin, having an electron collection surface;

prior to supplying an anode having an electron collection surface, coating the fin surfaces with a thin coat of oxide;

shielding the electron collection surface of the anode from the deposition of a second material;

sputter depositing the substrate top surface to form a second material film; and, wherein shielding an electron collection surface of an anode from the target first material includes forming an anode with vertical and horizontal ribs, and a fin having a top surface and a bottom surface to collect electrons, interposed between the anode ribs.

* * * * *